(12) United States Patent
Liu et al.

(10) Patent No.: US 9,935,171 B2
(45) Date of Patent: *Apr. 3, 2018

(54) VERTICAL MEMORY CELL STRING WITH DIELECTRIC IN A PORTION OF THE BODY

(71) Applicant: Micron Technology, Inc., Boise, ID (US)

(72) Inventors: Haitao Liu, Boise, ID (US); Akira Goda, Boise, ID (US); Chandra Mouli, Boise, ID (US); Krishna K. Parat, Palo Alto, CA (US)

(73) Assignee: Micron Technology, Inc., Boise, ID (US)

( * ) Notice: Subject to any disclaimer, the term of this patent is extended or adjusted under 35 U.S.C. 154(b) by 0 days.

This patent is subject to a terminal disclaimer.

(21) Appl. No.: 15/255,402

(22) Filed: Sep. 2, 2016

(65) Prior Publication Data
US 2016/0372556 A1 Dec. 22, 2016

Related U.S. Application Data

(63) Continuation of application No. 14/581,774, filed on Dec. 23, 2014, now Pat. No. 9,437,608, which is a continuation of application No. 13/592,086, filed on Aug. 22, 2012, now Pat. No. 8,921,891.

(51) Int. Cl.
| | | |
|---|---|---|
| *H01L 29/49* | (2006.01) | |
| *H01L 29/40* | (2006.01) | |
| *H01L 29/788* | (2006.01) | |
| *H01L 29/792* | (2006.01) | |
| *H01L 27/11556* | (2017.01) | |
| *H01L 27/11582* | (2017.01) | |
| *H01L 27/11524* | (2017.01) | |
| *H01L 27/1157* | (2017.01) | |

(52) U.S. Cl.
CPC ........ *H01L 29/408* (2013.01); *H01L 27/1157* (2013.01); *H01L 27/11524* (2013.01); *H01L 27/11556* (2013.01); *H01L 27/11582* (2013.01); *H01L 29/7889* (2013.01); *H01L 29/7926* (2013.01)

(58) Field of Classification Search
CPC ............. H01L 29/408; H01L 27/11524; H01L 27/11556
See application file for complete search history.

(56) References Cited

U.S. PATENT DOCUMENTS 6,849,905 B2 * 2/2005 Ilkbahar ................ H01L 29/792
257/390
8,203,187 B2 * 6/2012 Lung .................. G11C 16/0458
257/197

(Continued)

*Primary Examiner* — Michael Shingleton
(74) *Attorney, Agent, or Firm* — Schwegman Lundberg & Woessner, P.A.

(57) ABSTRACT

Some embodiments include a memory cell string having a body having a channel extending therein and in contact with a source/drain, a select gate adjacent to the body, a plurality of access lines adjacent to the body, and a dielectric in a portion of the body between the source/drain and a level corresponding to an end of the plurality of access lines most adjacent to the select gate. The dielectric in the portion of the body does not extend along an entire length of the body. Other embodiments are described and claimed.

20 Claims, 5 Drawing Sheets

(56) References Cited

U.S. PATENT DOCUMENTS

| | | | |
|---|---|---|---|
| 8,796,091 B2 * | 8/2014 | Chang | H01L 27/11551 257/329 |
| 8,921,891 B2 | 12/2014 | Liu et al. | |
| 9,437,608 B2 | 9/2016 | Liu et al. | |
| 2005/0128807 A1 * | 6/2005 | Chen | G11C 8/08 365/185.17 |
| 2008/0237698 A1 * | 10/2008 | Mokhlesi | H01L 27/115 257/326 |
| 2011/0286283 A1 * | 11/2011 | Lung | G11C 16/0483 365/185.28 |
| 2013/0279257 A1 | 10/2013 | Costa et al. | |
| 2014/0054666 A1 | 2/2014 | Liu et al. | |
| 2014/0203346 A1 | 7/2014 | Lee | |
| 2014/0264527 A1 | 9/2014 | Koval et al. | |
| 2015/0079765 A1 | 3/2015 | Pachamuthu et al. | |
| 2015/0108560 A1 | 4/2015 | Liu et al. | |
| 2015/0162342 A1 | 6/2015 | Lee et al. | |

* cited by examiner

VERTICAL MEMORY CELL STRING WITH DIELECTRIC IN A PORTION OF THE BODY

PRIORITY APPLICATION

This application is a continuation of U.S. application Ser. No. 14/581,774, filed Dec. 23, 2014, which is a continuation of U.S. application Ser. No. 13/592,086, filed Aug. 22, 2012, now issued as U.S. Pat. No. 8,921,891, all of which are incorporated herein by reference in their entirety.

BACKGROUND

With the development of the semiconductor industry, three-dimensional (3D) memory devices (e.g., 3D NAND memory devices) are widely used. However, floating channels existing in these devices risk boosting failure (e.g., boosting collapse) during a voltage boosting operation. For example, select gate (SG) snapback may occur under the influence of a high electric field imposed on the gate.

DETAILED DESCRIPTION

In the following detailed description of the embodiments, reference is made to the accompanying drawings which form a part hereof, and in which is shown by way of illustration specific illustrative embodiments in which the embodiments of the invention may be practiced. These embodiments are described in sufficient detail to enable those of ordinary skill in the art to practice the embodiments of the invention, and it is to be understood that other embodiments may be utilized and that logical, mechanical and electrical changes may be made without departing from the scope of the embodiments presented herein.

The term "horizontal" as used in this document is defined as a plane parallel to the conventional plane or surface of a substrate, such as wafer or die, regardless of the orientation of the substrate. The term "vertical" refers to a direction perpendicular to the horizontal as defined above. Prepositions, such as "on", "side", "higher", "lower", "over" and "under" are defined with respect to the conventional plane or surface being on the top surface of the substrate, regardless of the orientation of the substrate.

Recently, 3D architectures (e.g., 3D NAND memory devices) are used due to severe scaling challenges. Most 3D memory devices use poly-silicon (polySi) as the channel material. However, 3D memory device channels may be floating during operation, with a risk of boosting failure during a boosting operation, because of a select-gate (SG) snapback under a high electric field. When a high electric field exists during a boosting operation, excessive holes may be generated and accumulated in a body adjacent to the select gate, turning on an associated N+/P− junction. As a result, more electron/hole pairs may be generated due to Impact Ionization (I.I.). Such a positive feedback may eventually cause a boosting failure (e.g., boosting collapse) of the 3D architecture. Thus, improved memory devices are desirable to reduce or eliminate boosting failures. The embodiments described herein therefore propose the use of mechanisms that can be applied to 3D architectures with floating channels to suppress I.I. generation and hole accumulation, and thus, to reduce the risk of boosting collapse within 3D architectures during boosting operations.

Figure 1:
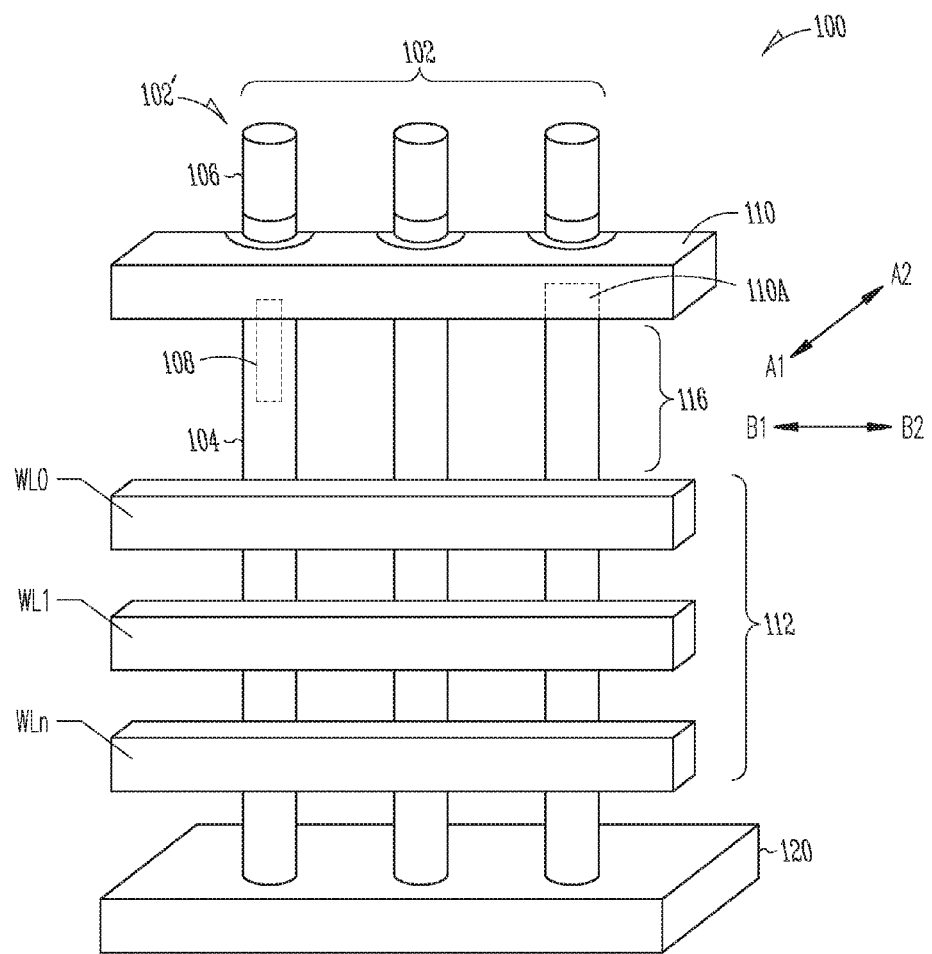
FIG. 1 is a perspective diagram illustrating a portion of a memory device according to an embodiment of the invention.

FIG. 1 is a perspective diagram illustrating a portion of a memory device 100 according to an embodiment. The memory device 100 includes strings of memory cells 102 (e.g., NAND strings), which are formed over a substrate 120. The arrangement of the strings of memory cells 102 is not limited to what is shown in FIG. 1; this is merely one example of many possibilities.

Figure 2:
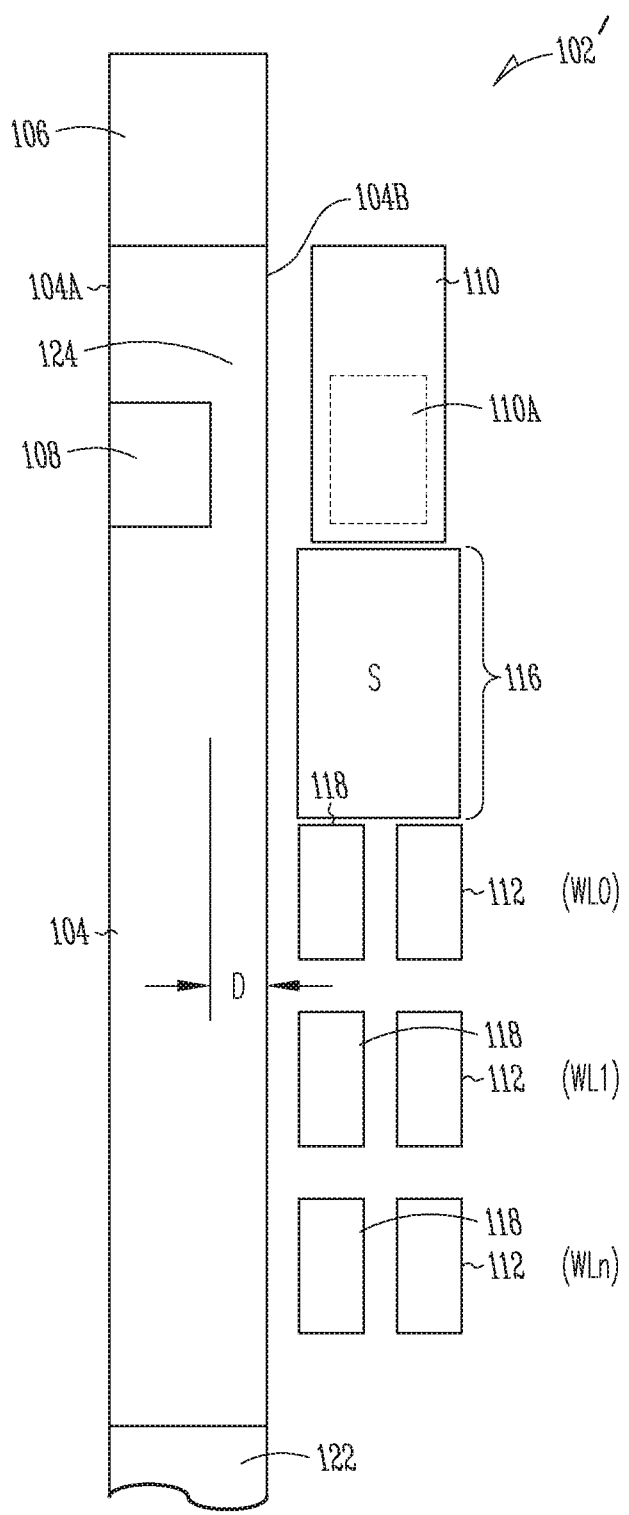
FIG. 2 is a cross sectional diagram illustrating a portion of a memory cell string according to an embodiment of the invention.
Figure 3:
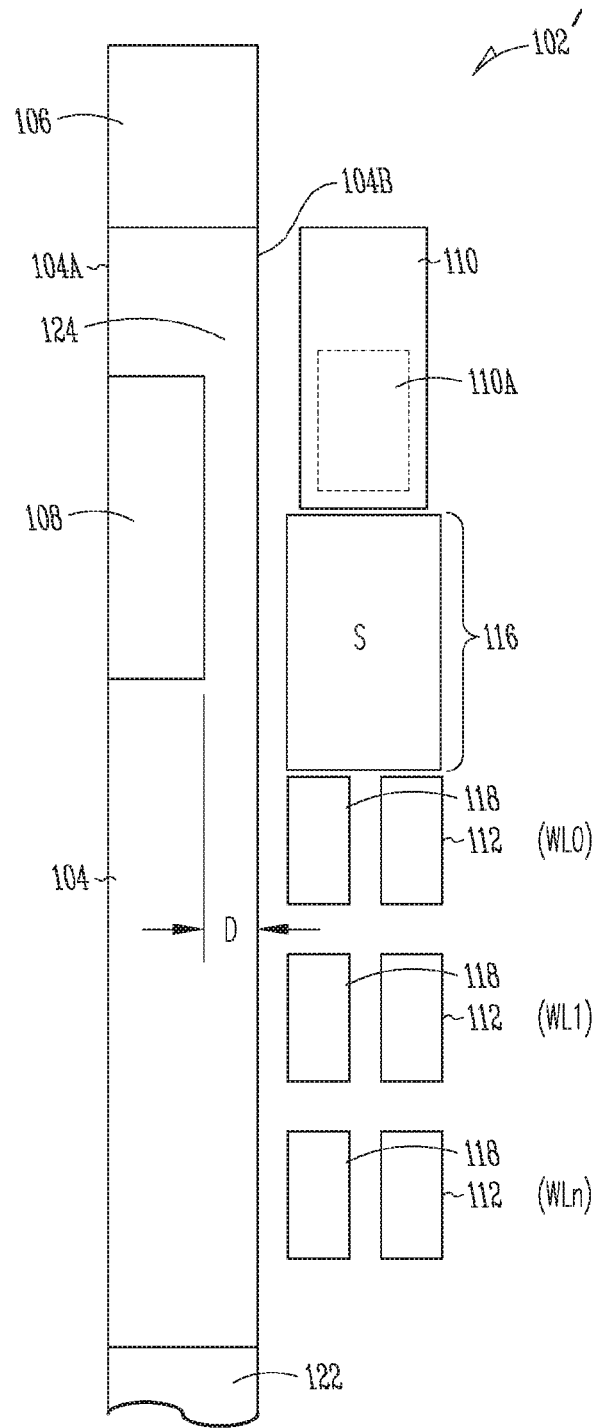
FIG. 3 is a cross sectional diagram illustrating a portion of another memory cell string according to another embodiment of the invention.

Each string 102' of the memory cell strings 102 can be constructed in a similar manner. Thus, only one memory cell string 102' of the strings of memory cells 102 is described herein in detail with respect to each of the specifically discussed embodiments. The memory cell string 102' includes a body (such as a vertical body) 104, which may comprise any semiconductor material, either doped or undoped. The body 104 of the memory cell string 102' includes a channel 124 (as shown in FIG. 2) extending inside the body 104 and in contact with a source/drain 106 (as used herein, "source/drain" is used to alternatively refer to either a source or a drain, and can include, for example, a portion of semiconductor material doped differently than the body, wherein the portion can be considered either a source or a drain depending on operation of the string; it does not necessarily mean, however, that the portion must be used as both a source and a drain during an operation(s) of the string). A dielectric 108 is in a portion of the body 104. The body 104 (e.g., channel 124) may also be in contact with a second source/drain, such as drain 122 (as shown in FIGS. 2 and 3). The body 104 may be formed as a rectangular or cylindrical pillar.

FIG. 2 is a cross sectional diagram illustrating a portion of a memory cell string 102' (as shown in FIG. 1) according to an embodiment. This cross sectional view shows a portion of an enlarged memory cell string 102', which is sliced along a direction A1-A2 (as shown in FIG. 1) and is viewed along a direction B1-B2 (as shown in FIG. 1). Referring now to FIGS. 1 and 2, it can be seen that a select gate 110 horizontally extends across an array of the bodies 104 of an array of memory cell strings 102. The select gate 110 can at least partially surround each of the bodies 104, and in some embodiments completely surrounds each of the bodies. The dielectric 108 is disposed apart from a side 104B of the body 104 by a distance D, where side 104B is adjacent to the select gate 110. In some embodiments, the distance D is between about 5 nm to about 15 nm.

A plurality of access lines 112 horizontally extend across the array of the bodies 104. Each of the access lines 112 may at least partially surround each of the bodies 104, and in some embodiment completely surround each of the bodies. In the art, access lines 112 are conventionally referred to as word lines (such as word lines WL0, WL1 . . . WLn).

The dielectric 108 is formed in a portion of the body 104 of the memory cell string 102' that is adjacent to a corner of the select gate 110. For example, the dielectric 108 in the portion can be adjacent to a portion 110A of the select gate 110. The portion 110A of the select gate 110, which can be about a half of the select gate adjacent to the plurality of access lines 112, is defined as a select-gate portion ("SG portion") 110A. (See FIGS. 2 and 3). A region vertically between the select gate 110 (e.g., a lower extent of the select gate 110) and the access lines 112 (e.g., an upper extent of the access line 112 most adjacent to the select gate 110) is defined as a select-gate/word-line region "SG-WL0 region" 116. (See FIGS. 2 and 3).

The dielectric 108 is formed in a portion of the body 104 of the memory cell string 102' between the source/drain 106 and a level corresponding to an end of the plurality of access lines 112 most adjacent to the select gate 110. For example, in the embodiment illustrated in FIG. 2, the dielectric 108 is in a portion of the body 104 that does not extend past an upper extent of the SG portion 110A of the select gate 110 (e.g., it does not contact the source/drain 106), and also does not extend past a lower extent of the SG portion 110A of the select gate 110. (See FIG. 2 for details).

In other embodiments, such as the embodiment illustrated in FIG. 3, the dielectric 108 is formed in a portion of the body 104 of the memory cell string 102' that does extend past the lower extent of the SG portion 110A of the select gate 110 (e.g., to a level within the SG-WL0 region). In some embodiments, the dielectric 108 in a portion of the body 104 can extend all the way to a level corresponding to the end of the plurality of access lines 112 most adjacent to the select gate 110 (e.g., an upper extent of the access line 112 most adjacent to the select gate 110). In some implementations, the dielectric 108 in the portion of the body 104 can be considered to be adjacent to a corner of the access line 112 of the plurality of access lines 112 most adjacent to the select gate 110. For sake of efficiency, numerous aspects of the embodiment of FIG. 3 that are similar to those already discussed with respect to FIG. 2 are not repeated herein. (See FIG. 3 for details).

The dielectric 108 added in a portion of the body 104 of the memory cell string 102' as described above may take up a volume of the channel inside the body 104, may partially block the channel 124, and may suppress holes accumulation in the select gate body, and thus may reduce the boosting failure during a boosting operation.

In addition, a plurality of storage elements 118 (not shown in FIG. 1, and referring to FIGS. 2 and 3 for details) are adjacent to the body 104 of the string 102'. As illustrated in FIGS. 2 and 3, each storage element may be between a respective one of the access lines 112 and the body 104 of the string 102'. The storage elements 118 may be any storage elements. For example, in some embodiments, the storage elements 118 may be Silicon-Oxide-Nitride-Oxide-Silicon "SONOS" type storage elements or Metal-Oxide-Nitride-Oxide-Semiconductor "MONOS" type storage elements. In other embodiments, the storage elements 118 may be floating gate "FG" type storage elements, such as those comprising polysilicon and/or metal, for example. The dielectric 108 may be any insulator, such as an oxide (e.g., $SiO_2$, $Al_3O_2$, and HfOx, etc.) or a nitride, for example. The select gate 110 and the access lines 112 may comprise, for example, poly-silicon and/or a metal. In some embodiments, the select gate 110 is separated from the body 104 by a gate oxide (not shown).

In some embodiments, the select gate 110 is vertically separated from the plurality of access lines 112 by a spacer S. The spacer S may be formed adjacent to a side 104B of the body 104, and vertically between the select gate 110 and the plurality of access lines 112. For example, the spacer S may be formed vertically between the select gate 110 and a word line WL0 of the plurality of access lines 112 (e.g., WL0, WL1 . . . WLn). The spacer S may by any insulator, such as an oxide, for example.

Figure 4:
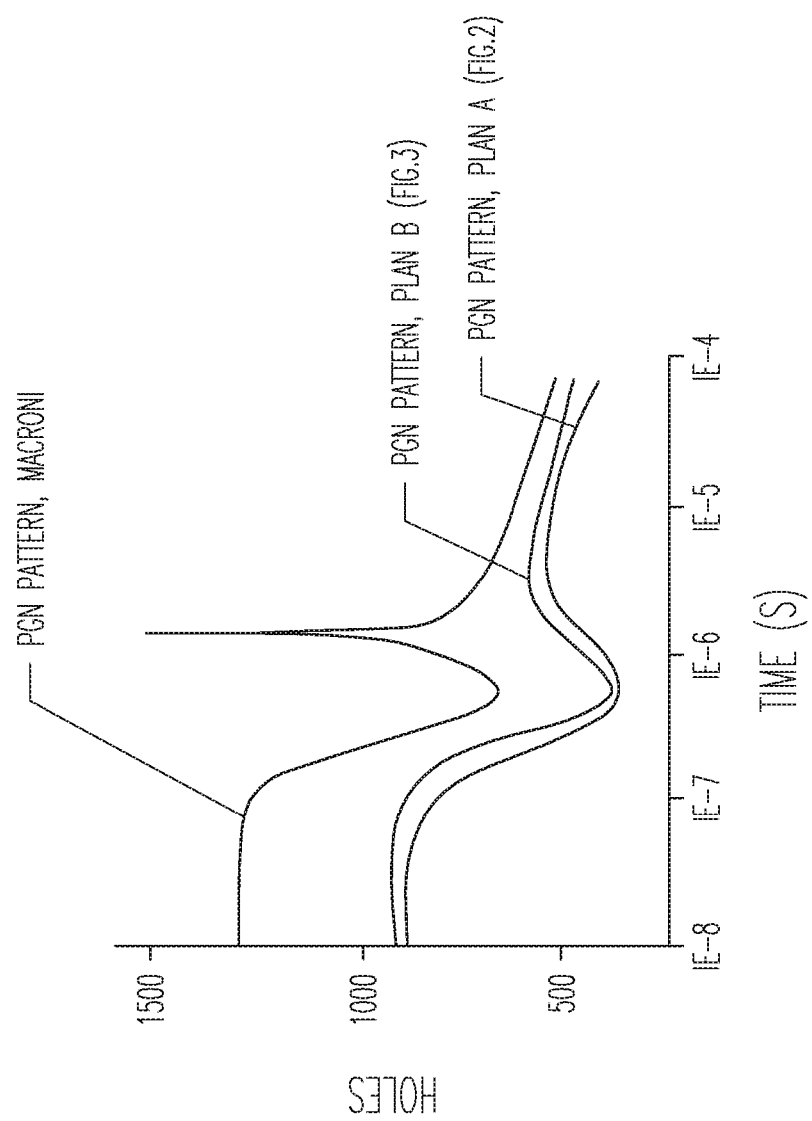
FIG. 4 shows a comparison result between the performance of a conventional vertical memory cell string and a vertical memory cell string according to an embodiment of the invention.

FIG. 4 illustrates an experimental result that shows a comparison between the performance of a conventional memory cell string and a memory cell string according to an embodiment described herein. Here, the numbers of holes that have been accumulated by the body of a memory cell string of Plan A (e.g., where the dielectric 108 is in a portion of the body 104 that does not extend past a lower extent of the SG portion 110A, such as shown in FIG. 2), a memory cell string of Plan B (e.g., where the dielectric 108 is in a portion of the body 104 that does extend past a lower extent of the SG portion 110A, such as shown in FIG. 3), and a conventional Macroni memory cell string (e.g., where the dielectric 108 is in a portion of the body 104 that extends along an entire length of the body 104), over time, during a program (PRG) operation. As shown in FIG. 4, compared with the conventional Macroni memory cell string, both of the memory cell strings 102 of Plan A (as shown in FIG. 2) and of Plan B (as shown in FIG. 3) more effectively suppress the accumulation of holes by the bodies (e.g., the sources) of the memory cell strings, which can reduce the risk of boosting collapse during boosting operations.

Figure 5:
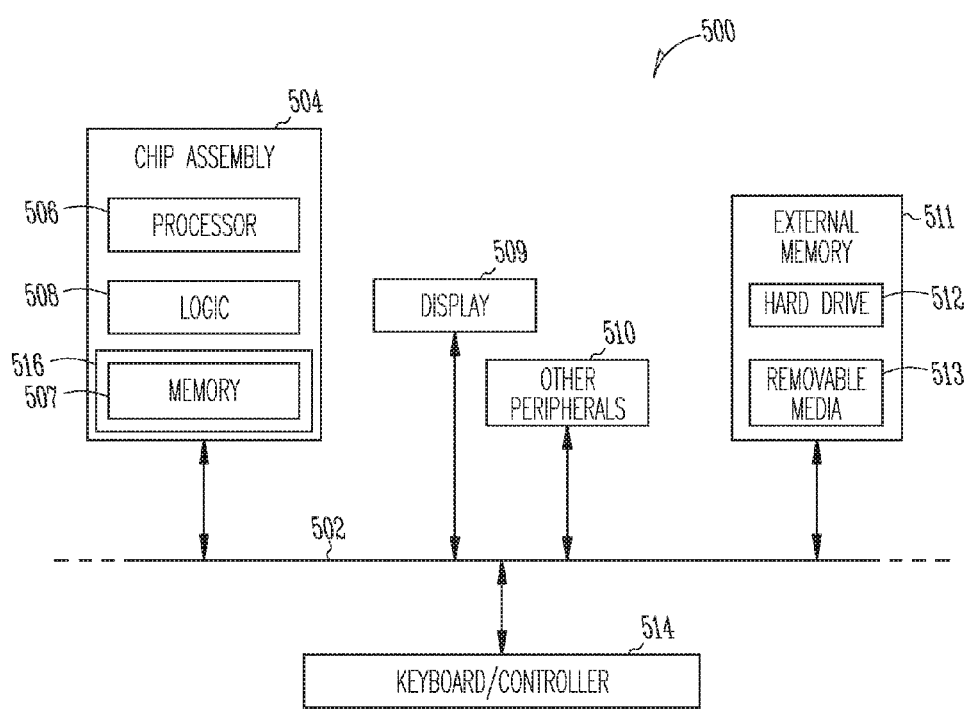
FIG. 5 is a block diagram illustrating an information handling system using a memory device according to an embodiment of the invention.

FIG. 5 is a block diagram illustrating an information handling system 500 using a memory device 100 according to any of the embodiments described above and shown in FIGS. 1-5. The information handling system 500 may include, but is not limited to, computers, cameras, personal data assistants (PDAs), cellular telephones, MP3 players, aircraft, satellites, military vehicles, etc.

In this example, the information handling system 500 comprises a data processing system that includes a system bus 502 to couple the various components of the system. System bus 502 provides communications links among the various components of the information handling system 500 and may be implemented as a single bus, as a combination of busses, or in any other suitable manner.

Chip assembly 504 is coupled to the system bus 502. Chip assembly 504 may include any circuit or be an operably compatible combination of circuits. In one embodiment, chip assembly 504 includes a processor 506 that can be of any type. As used herein, "processor" means any type of computational circuit such as, but not limited to, a microprocessor, a microcontroller, a graphics processor, a digital signal processor (DSP), or any other type of processor or processing circuit.

In one embodiment, a memory device 507 is included in the chip assembly 504. In one embodiment, the memory device 507 includes a memory device according to any of the embodiments described above.

In one embodiment, additional logic chips 508 other than processor chips are included in the chip assembly 504. An example of a logic chip 508 other than a processor includes an analog to digital converter. Other circuits on logic chips 508 such as custom circuits, an application-specific integrated circuit (ASIC), etc. are also included in some embodiments of the invention.

Information handling system 500 may also include an external memory 511, such as a memory device according to any of the embodiments described above and/or a hard drive(s) 512, and/or one or more drives that handle removable media 513 such as compact disks (CDs), flash drives, digital video disks (DVDs), and the like. The removable media 513 may also include a memory device, such as one according to any of the embodiments described above.

Information handling system 500 may also include a display device 509 such as a monitor, additional peripheral components 510, such as speakers, etc. and a keyboard and/or controller 514, which can include a mouse, trackball, game controller, voice-recognition device, or any other device that permits a system user to input information into and receive information from the information handling system 500. While a number of embodiments are described, the above lists are not intended to be exhaustive. Although specific embodiments have been illustrated and described herein, it will be appreciated by those of ordinary skill in the art that any arrangement that is calculated to achieve the same purpose may be substituted for the specific embodiment shown. This application is intended to cover any adaptations or variations of the disclosure. It is to be understood that the above description is intended to be illustrative and not restrictive. Combinations of the above embodiments, and other embodiments, will be apparent to those of skill in the art upon studying the above description.

The Abstract of the Disclosure is provided to comply with 37 C.F.R. §1.72(b), requiring an abstract that allows the reader to quickly ascertain the nature of the technical disclosure. It is submitted with the understanding that it will not be used to interpret or limit the claims. In addition, in the foregoing Detailed Description, it may be seen that various features are grouped together in a single embodiment for the purpose of streamlining the disclosure. This method of disclosure is not to be interpreted as limiting the claims. Thus, the following claims are hereby incorporated into the Detailed Description, with each claim standing on its own as a separate embodiment.

What is claimed is:

1. A memory cell string comprising:
   a channel formed in contact with a source/drain and under a select gate; and
   a dielectric formed within a portion of the channel under a portion of the select gate, and extending within the portion of the channel under the portion of the select gate.

2. The memory cell string of claim 1, further comprising an access line over the channel and adjacent to the channel.

3. The memory cell string of claim 2, wherein the select gate is located between the source/drain and the access line.

4. The memory cell string of claim 2, wherein the dielectric is positioned adjacent to a corner of the select gate that is adjacent to the access line.

5. The memory cell string of claim 1, wherein the dielectric is apart from the source/drain.

6. The memory cell string of claim 1, wherein the access line comprises a word line.

7. The memory cell string of claim 1, wherein the channel extends away from the source/drain.

8. The memory cell string of claim 1, further comprising a gate oxide formed on an inner side of the channel adjacent to the select gate to separate the channel from the select gate.

9. The memory cell string of claim 1, wherein the dielectric is formed on an inner side of the channel away from the select gate, and wherein the dielectric forms a gap in the channel.

10. A memory cell string comprising:
    a channel formed in contact with a source/drain, under a select gate, and under an access line, the select gate being between the source/drain and the access line; and
    a dielectric formed within a portion of the channel, and extending within the portion of the channel between a first position of the channel that is located under the select gate and a second position of the channel that is located between the select gate and the access line.

11. The memory cell string of claim 10, wherein the first position of the channel is positioned adjacent to a corner of the select gate that is adjacent to the access line.

12. The memory device of claim 10, wherein the dielectric partially blocks the channel and forms a gap in the channel in a direction that the channel extends.

13. A system including a memory device, wherein the memory device comprises a string of memory cells, the string of memory cells comprising:
    a body having a channel extending therein, the channel being in contact with a source/drain;
    a select gate adjacent to the body;
    a plurality of access lines adjacent to the body; and
    a dielectric in a portion of the channel, wherein the dielectric is adjacent to a corner of the select gate that is adjacent to the plurality of access lines.

14. The system of claim 13, wherein the dielectric partially blocks the channel and forms a gap in the channel in a direction that the channel extends.

15. The system of claim 13, wherein the dielectric comprises an oxide.

16. The system of claim 13, wherein the dielectric comprises a nitride.

17. The system of claim 13, wherein the string of memory cells comprises a string of NAND memory cells.

18. The system of claim 13, wherein the string of memory cells comprises a string of floating gate memory cells.

19. The system of claim 13, wherein the string of memory cells comprise a string of Silicon-Oxide-Nitride-Oxide-Silicon (SONOS) memory cells.

20. The system of claim 13, wherein the string of memory cells comprise a string of Metal-Oxide-Nitride-Oxide-Silicon (MONOS) memory cells.

* * * * *